United States Patent
Lee et al.

(10) Patent No.: US 8,822,617 B2
(45) Date of Patent: Sep. 2, 2014

(54) COPOLYMER FOR ORGANIC ANTIREFLECTIVE FILM, MONOMER, AND COMPOSITION COMPRISING THE COPOLYMER

(75) Inventors: Jin Han Lee, Chungcheongnam-do (KR); Shin Hyo Bae, Chungcheongnam-do (KR); Seung Hee Hong, Chungcheongnam-do (KR); Eun Hee Han, Chungcheongnam-do (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 66 days.

(21) Appl. No.: 13/456,777

(22) Filed: Apr. 26, 2012

(65) Prior Publication Data

US 2012/0296059 A1 Nov. 22, 2012

(30) Foreign Application Priority Data

Apr. 26, 2011 (KR) .................. 10-2011-0038863

(51) Int. Cl.
| | |
|---|---|
| *C08F 220/26* | (2006.01) |
| *C08F 220/28* | (2006.01) |
| *C08F 220/30* | (2006.01) |
| *C08F 222/08* | (2006.01) |
| *C08F 220/22* | (2006.01) |
| *C08F 222/06* | (2006.01) |
| *G03F 7/09* | (2006.01) |

(52) U.S. Cl.
CPC ............ *C08F 220/22* (2013.01); *C08F 222/06* (2013.01); *G03F 7/091* (2013.01)
USPC ............ 526/326; 526/245; 526/271; 526/320

(58) Field of Classification Search
CPC .... C08F 220/26; C08F 220/28; C08F 220/30; C08F 222/08
USPC .................. 526/245, 271, 320, 326
See application file for complete search history.

(56) References Cited

U.S. PATENT DOCUMENTS

| | | | |
|---|---|---|---|
| 4,128,709 A * | 12/1978 | Vollkommer et al. | 525/169 |
| 2006/0177774 A1* | 8/2006 | Abdallah et al. | 430/311 |
| 2008/0318167 A1* | 12/2008 | Kim et al. | 430/319 |
| 2011/0159252 A1* | 6/2011 | Ober et al. | 428/195.1 |

FOREIGN PATENT DOCUMENTS

| | | |
|---|---|---|
| CN | 101142533 A | 3/2008 |
| JP | 2008-532059 A | 8/2008 |
| JP | 2009-1792 A | 1/2009 |
| KR | 10-2008-0114492 A | 12/2008 |
| TW | 200944546 A1 | 11/2009 |

OTHER PUBLICATIONS

Thamizharasi et al. Iranian Polymer Journal, 5(1), 1996, 42-49.*
J. H. Nihada, International Journal of Basic & Applied Sciences IJBAS-IJENS, 12(02), 2012, 58-67.*
Office Action from the Korean Intellectual Property Office dated Dec. 20, 2012, issued in corresponding Korean Patent Application 10-2011-0038863.
Taiwanese Office Action dated Jan. 28, 2014 in connection with the corresponding Taiwanese patent application.

* cited by examiner

*Primary Examiner* — Vu A Nguyen
(74) *Attorney, Agent, or Firm* — Davidson, Davidson & Kappel, LLC

(57) ABSTRACT

Disclosed are a copolymer for organic antireflective films containing a repeating unit represented by the following formula (1), a monomer for the copolymer, and an organic antireflective film composition including the copolymer:

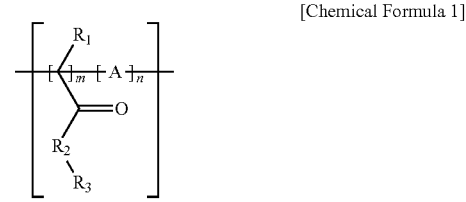

[Chemical Formula 1]

wherein in the formula (1), $R_1$, $R_2$, $R_3$, A, m and n respectively have the same meanings as defined in the detailed description of the invention. The organic antireflective film composition including the copolymer for organic antireflective films has an increased refractive index and exhibits excellent effects when produced into an antireflective film, and hydrophilicity and hydrophobicity of the coating film produced from the composition can be regulated, so that excellent compatibility with resists can be obtained.

6 Claims, 3 Drawing Sheets

COPOLYMER FOR ORGANIC ANTIREFLECTIVE FILM, MONOMER, AND COMPOSITION COMPRISING THE COPOLYMER

This application is a national phase application and claims priority under 35 U.S.C. §119 from Korean Patent Application No. 10-2011-0038863 filed Apr. 26, 2011, the disclosure of which is hereby incorporated by reference herein in its entirety.

BACKGROUND OF THE INVENTION

1. Field of the Invention

The present invention relates to a copolymer for organic antireflective films, a monomer for the copolymer, and a composition including the copolymer, and more particularly, to a copolymer which has an increased refractive index and thus has an excellent effect when produced into an organic antireflective film, and which allows regulation of the hydrophilicity and hydrophobicity of the coating film, thereby having excellent compatibility with resists, a monomer for the copolymer, and a composition including the copolymer.

2. Description of the Related Art

Recently, along with high integration of semiconductor devices, there is a demand for ultrafine patterns having a line width of 0.10 micrometers or less in the production of ultra-large scale integrated circuits (LSI) and the like. Accordingly, the exposure light wavelength has also been further shortened in the region of g-line or i-line that has been conventionally used, and more attention is paid to studies on lithography using a KrF excimer laser or an ArF excimer laser.

Since it is necessary to reduce the influence of diffuse reflection of active rays at the substrate or the influence of standing waves in the exposure process, and the pattern size in the semiconductor device in ultra-large scale integrated circuits are ever decreasing, their reflectance should also be minimized. Otherwise, it is difficult to form a uniform pattern, and adequate process margins cannot be obtained, so that it is difficult to achieve a desired yield.

Therefore, in order to decrease the reflectance as much as possible, an antireflective film is applied, and inorganic antireflective films produced by applying titanium, titanium dioxide, chromium oxide or the like, and organic antireflective films formed from polymer compounds having light absorption properties can be applied.

Therefore, more importance is given to a technology of regulating the reflectance by disposing an organic antireflective film containing organic molecules capable of absorbing light, under a photoresist, and thereby preventing the reflection of lower film layers while removing standing waves.

An organic antireflective film should, firstly, contain a substance which is capable of absorbing light in the wavelength region of the exposure light source in order to prevent the reflection of lower film layers, and secondly, in the process of laminating an antireflective film and then laminating a photoresist, the antireflective film should not be dissolved and destroyed by the solvent of the photoresist.

Thirdly, the antireflective film should be able to be more rapidly etched than the photoresist in the upper part, so that the loss of photoresist for etching the lower film layers can be reduced. Fourthly, the antireflective film should not have reactivity toward the photoresist in the upper part, and compounds such as amines and acids should not migrate to the photoresist layer. It is because, otherwise, a morphology, particularly footing or undercut of the photoresist patterns can be induced.

Fifthly, the antireflective film should have optical properties that are adequate for various exposure processes in accordance with various substrates, that is, an appropriate refractive index and an appropriate extinction coefficient, and the antireflective film should have an appropriate adhesive power to the substrate and the photoresist.

However, under the current circumstances, an antireflective film that is satisfactory for an ultrafine pattern forming process where ArF light is used, has not been developed to date.

Therefore, the development of an organic antireflective substance having large absorbency for a specific wavelength in order to prevent the standing waves occurring at the time of exposure particularly to a wavelength of 193 nm, and reflection by means of an antireflective film, is coming to the fore as an urgent issue.

SUMMARY OF THE INVENTION

It is an object of the present invention to provide a light absorber which has high refraction characteristics particularly in the wavelength range around 193 nm and has increased compatibility with photoresists, and a copolymer containing this light absorber. It is another object of the present invention to provide a composition for organic antireflective films including the copolymer described above.

In order to achieve the objects described above, according to an embodiment of the present invention, there is provided a copolymer for organic antireflective films containing a repeating unit represented by the following formula (1):

[Chemical Formula 1]

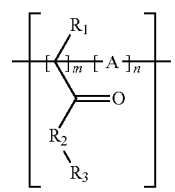

wherein in the formula (1), $R_1$ represents any one selected from the group consisting of a hydrogen atom, an alkyl group having 1 to 10 carbon atoms, and a heteroalkyl group having 1 to 6 carbon atoms; $R_2$ represents any one selected from the group consisting of CR'R", NR', O and S; R' and R" each independently represent any one selected from the group consisting of a hydrogen atom and an alkyl group having 1 to 5 carbon atoms; $R_3$ represents any one selected from the group consisting of an alkyl group, a heteroalkyl group, a cycloalkyl group, a heterocycloalkyl group, an aryl group, a heteroaryl group, an arylalkyl group, a heteroarylalkyl group, a vinylalkyl group and a heterovinylalkyl group, while at least one hydrogen atom contained in $R_3$ may be substituted by any one selected from the group consisting of a halogen atom, a cyano group, a nitro group, a phenyl group and combinations thereof; m and n satisfy the following relations: m+n=1, $0.05 < m/(m+n) < 0.95$, and $0.05 < n/(m+n) < 0.95$; and A represents the following formula (2) or formula (3):

[Chemical Formula 2]

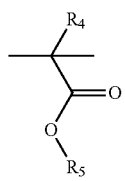

wherein in the formula (2), $R_4$ represents any one selected from the group consisting of a hydrogen atom and an alkyl group having 1 to 10 carbon atoms; $R_5$ represents any one selected from the group consisting of a hydrogen atom, an alkyl group, a heteroalkyl group, a cycloalkyl group, a heterocycloalkyl group, an aryl group, a heteroaryl group, an arylalkyl group and a heteroarylalkyl group, while at least one hydrogen atom contained in $R_5$ is substituted by any one selected from the group consisting of a hydroxyl group, a carboxyl group, a halogen atom, a cyano group, a nitro group and combinations thereof; and

[Chemical Formula 3]

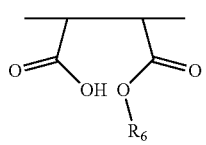

wherein in the formula (3), $R_6$ represents any one selected from the group consisting of a hydrogen atom, an alkyl group, a cycloalkyl group, a heteroalkyl group and a cycloheteroalkyl group.

The repeating unit represented by the formula (1) may have an extinction coefficient of 0.1 to 1.2.

In the repeating unit represented by the formula (1), $R_3$ may be any one selected from the group consisting of groups represented by the following formulas (1-1) to (1-8):

[Chemical Formula 1-1]

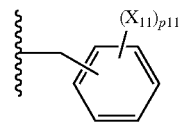

[Chemical Formula 1-2]

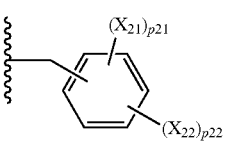

[Chemical Formula 1-3]

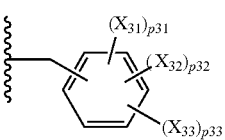

[Chemical Formula 1-4]

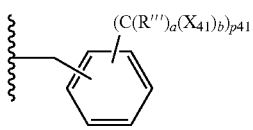

[Chemical Formula 1-5]

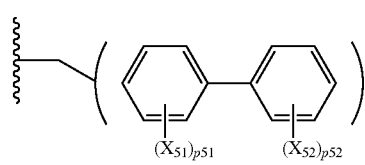

[Chemical Formula 1-6]

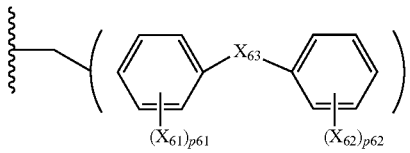

[Chemical Formula 1-7]

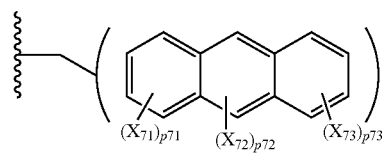

[Chemical Formula 1-8]

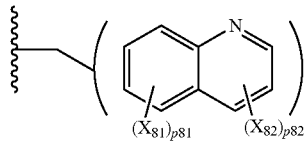

wherein in the formulas (1-1) to (1-8), $X_{11}$, $X_{21}$, $X_{22}$, $X_{31}$, $X_{32}$, $X_{33}$, $X_{51}$, $X_{52}$, $X_{61}$, $X_{62}$, $X_{71}$, $X_{72}$, $X_{73}$, $X_{81}$ and $X_{82}$ each independently represent any one selected from the group consisting of a halogen atom, a cyano group, a nitro group and a phenyl group; $R'''$ represents any one selected from the group consisting of a hydrogen atom and a methyl group; $X_{41}$ represents a halogen atom; a represents an integer from 1 to 3; b represents an integer from 1 to 3; the sum a+b is 3; $X_{63}$ represents any one selected from the group consisting of O, NR', S and CO; p11 represents an integer from 1 to 5; p21 and p22 each independently represent an integer from 1 to 4; the sum of p21 and p22 does not exceed 5; p31 to p33 each independently represent an integer from 1 to 3; the sum of p31 to p33 does not exceed 5; p41 represents an integer from 1 to 5; p51 and p52 each independently represent an integer from 1 to 5; the sum of p51 and p52 does not exceed 9; p61 and p62 each independently represent an integer from 1 to 5; the sum of p61 and p62 does not exceed 9; p71 and p73 each independently represent an integer from 1 to 5; p72 represents an integer from 1 to 2; the sum of p71 to p73 does not exceed 9; p81 represents an integer from 1 to 4; p82 represents an integer from 1 to 3; and the sum of p81 and p82 does not exceed 6.

The copolymer may contain any one selected from the group consisting of repeating units represented by the following formulas (2-1) to (2-6):

[Chemical Formula 2-1]

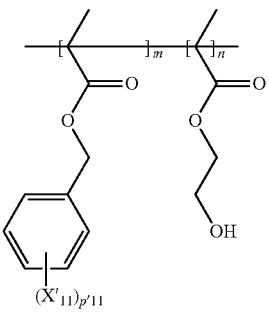

[Chemical Formula 2-2]

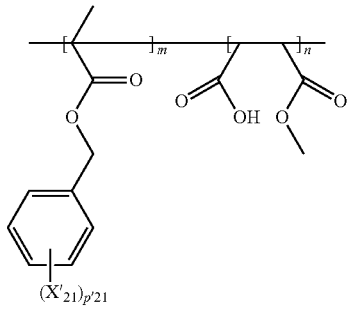

[Chemical Formula 2-3]

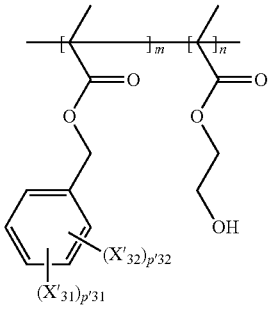

[Chemical Formula 2-4]

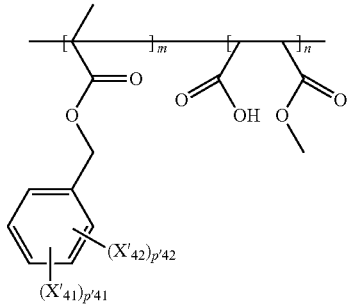

[Chemical Formula 2-5]

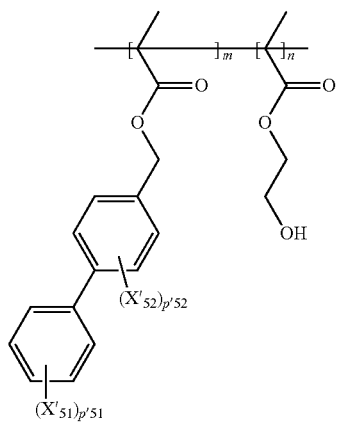

[Chemical Formula 2-6]

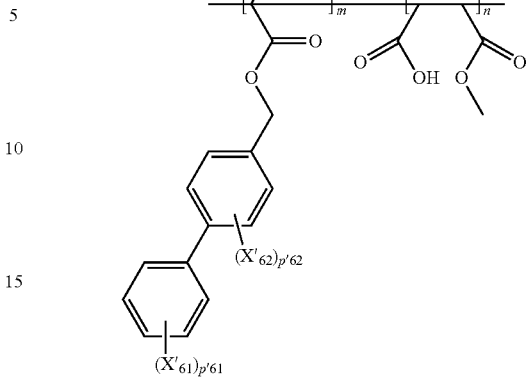

wherein in the formulas (2-1) to (2-6), $X'_{11}$, $X'_{21}$, $X'_{31}$, $X'_{31}$, $X'_{41}$, $X'_{42}$, $X'_{51}$, $X'_{52}$, $X'_{61}$ and $X'_{62}$ each independently represent any one selected from the group consisting of a halogen atom, a perfluoroalkyl group, a cyano group, a nitro group and a phenyl group; $m$ and $n$ satisfy the following relations: $m+n=1$, $0.05<m/(m+n)<0.95$, and $0.05<n/(m+n)<0.95$; $p'11$ and $p'12$ each independently represent an integer from 1 to 5; $p'31$, $p'32$, $p'41$ and $p'42$ each independently represent an integer from 1 to 4; the sum of $p'31$ and $p'32$ does not exceed 5; the sum of $p'41$ and $p'42$ does not exceed 5; $p'51$ and $p'61$ each independently represent an integer from 1 to 5; and $p'52$ and $p'62$ each independently represent an integer from 1 to 4.

The copolymer for organic antireflective films may have a weight average molecular weight of 1,000 g/mol to 100,000 g/mol as calculated relative to polystyrene standards.

The monomer for forming the copolymer for organic antireflective films according to another embodiment of the present invention is represented by the formula (1) shown above.

The composition for organic antireflective films according to another embodiment of the present invention includes the copolymer described above.

DESCRIPTION OF THE PREFERRED EMBODIMENTS

Figure 1:
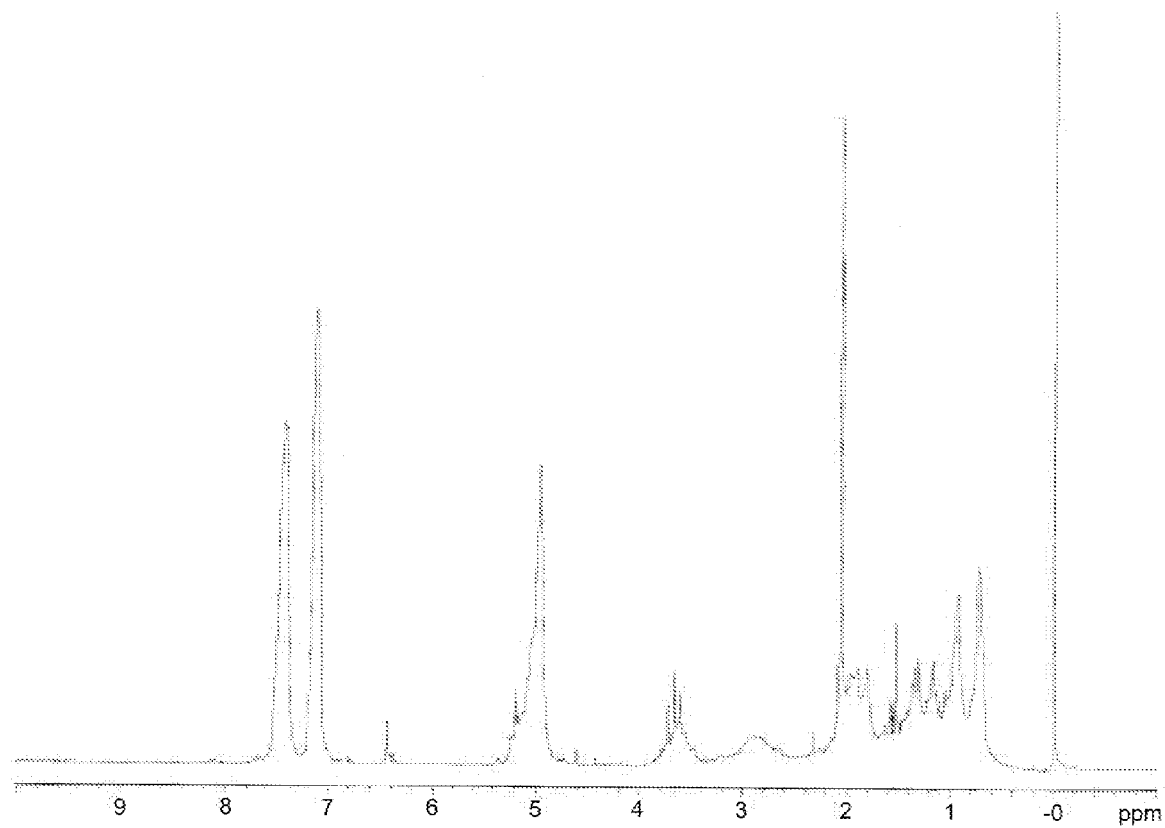
FIG. 1 is a diagram showing the NMR data of the compound represented by formula (3-2) obtained in Synthesis Example 2.

Hereinafter, the present invention will be described in more detail.

Unless particularly stated otherwise herein, the prefix "hetero-" means that carbon atoms are substituted with one to three heteroatoms selected from the group consisting of —N—, —O—, —S— and —P—. For example, a heteroalkyl group means that one to three carbon atoms among the carbon atoms of an alkyl group are substituted with heteroatoms.

Unless particularly stated otherwise herein, the term "halogenated" means that a hydrogen atom has been substituted by any one selected from the group consisting of fluorine, chlorine, bromine and iodine.

Unless particularly stated otherwise herein, the term halogen atom means any one selected from the group consisting of fluorine, chlorine, bromine and iodine.

Unless particularly stated otherwise herein, the term alkyl group encompasses a linear alkyl group and a branched alkyl group, and examples include a primary alkyl group, a secondary alkyl group and a tertiary alkyl group.

Unless particularly stated otherwise herein, examples of the cycloalkyl group include monocyclic, bicyclic, tricyclic and tetracyclic cycloalkyl groups. Examples of the cycloalkyl group also include polycyclic cycloalkyl groups, including an adamantyl group and a norbornyl group.

Unless particularly stated otherwise, the term aryl group as used herein means a hydrocarbon containing one or two or more aromatic rings. Examples include a benzyl group and a naphthyl group.

Unless particularly stated otherwise, the term arylalkyl group means a compound containing an aryl group and an alkanediyl group, or a derivative thereof. The alkanediyl is a divalent atomic group obtainable by excluding two hydrogen atoms from an alkane, and may be represented by the formula: $-C_nH_{2n}-$.

Unless particularly stated otherwise, the term vinylalkyl group means a compound containing a vinyl group and an alkanediyl group, or a derivative thereof.

Unless particularly stated otherwise, the perfluoroalkyl group means an alkyl group in which a part of the hydrogen atoms or all of the hydrogen atoms have been substituted by fluorine atoms.

Unless particularly stated otherwise, the alkyl group means an alkyl group having 1 to 40 carbon atoms; the heteroalkyl group means a heteroalkyl group having 1 to 40 carbon atoms; the cycloalkyl group means a cycloalkyl group having 3 to 40 carbon atoms; the heterocycloalkyl group means a heterocycloalkyl group having 1 to 40 carbon atom; the aryl group means an aryl group having 6 to 40 carbon atoms; the heteroaryl group means a heteroaryl group having 2 to 40 carbon atoms; the arylalkyl group means an arylalkyl group having 7 to 40 carbon atoms; the heteroarylalkyl group means a heteroarylalkyl group having 7 to 40 carbon atoms; the vinylalkyl group means a vinylalkyl group having 4 to 40 carbon atoms; and the heterovinylalkyl group means a heterovinylalkyl group having 3 to 40 carbon atoms.

Unless particularly stated otherwise, all the compounds or substituents used herein may be substituted or unsubstituted. Here, the term "substituted" means that a hydrogen atom is substituted by any one selected from the group consisting of a halogen atom, a hydroxyl group, a carboxyl group, a cyano group, a nitro group, an amino group, a thio group, a methylthio group, an alkoxy group, a nitrile group, an aldehyde group, an epoxy group, an ether group, an ester group, a carbonyl group, an acetal group, a ketone group, an alkyl group, a cycloalkyl group, a heterocycloalkyl group, an allyl group, a benzyl group, an aryl group, a heteroaryl group, a perfluoroalkyl group, derivatives thereof, and combinations thereof.

The copolymer for organic antireflective films according to an embodiment of the present invention includes a repeating unit represented by the following formula (1):

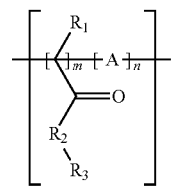

[Chemical Formula 1]

In the formula (1), $R_1$ represents any one selected from the group consisting of a hydrogen atom, an alkyl group having 1 to 10 carbon atoms, and a heteroalkyl group having 1 to 6 carbon atoms, and $R_1$ may be any one selected from the group consisting of a hydrogen atom and an alkyl group having 1 to 5 carbon atoms.

In the formula (1), $R_2$ represents any one selected from the group consisting of CR'R", NR', O and S, and R' and R" each independently represent any one selected from the group consisting of a hydrogen atom and an alkyl group having 1 to 5 carbon atoms, while $R_2$ may be $-CH_2-$.

In the formula (1), $R_3$ represents any one selected from the group consisting of an alkyl group, a heteroalkyl group, a cycloalkyl group, a heterocycloalkyl group, an aryl group, a heteroaryl group, an arylalkyl group, a heteroarylalkyl group, a vinylalkyl group and a heterovinylalkyl group, and at least one hydrogen atom contained in $R_3$ is substituted by any one selected from the group consisting of a halogen atom, a cyano group, a nitro group, a phenyl group and combinations thereof.

In the formula (1), $R_3$ may be any one selected from the group consisting of groups represented by the following formulas (1-1) to (1-8):

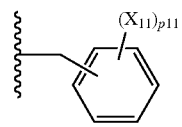

[Chemical Formula 1-1]

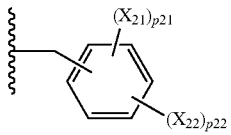

[Chemical Formula 1-2]

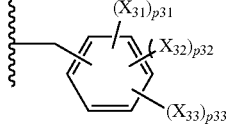

[Chemical Formula 1-3]

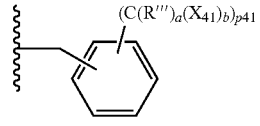

[Chemical Formula 1-4]

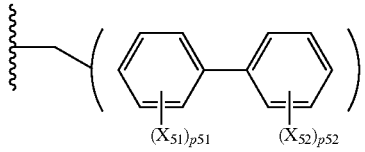

[Chemical Formula 1-5]

[Chemical Formula 1-6]

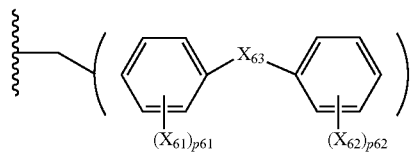

[Chemical Formula 1-7]

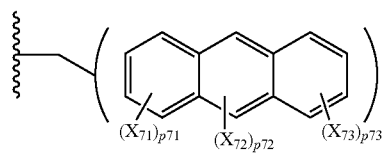

[Chemical Formula 1-8]

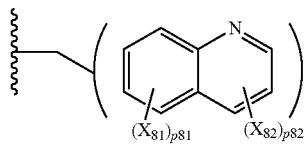

In the formulas (1-1) to (1-8), $X_{11}$, $X_{21}$, $X_{22}$, $X_{31}$, $X_{32}$, $X_{33}$, $X_{51}$, $X_{52}$, $X_{61}$, $X_{62}$, $X_{71}$, $X_{72}$, $X_{73}$, $X_{81}$ and $X_{82}$ each independently represent any one selected from the group consisting of a halogen atom, a cyano group, a nitro group and a phenyl group.

In the formula (1-4), R''' represents any one selected from the group consisting of a hydrogen atom and a methyl group; $X_{41}$ represents a halogen atom; a represents an integer from 1 to 3; b represents an integer from 1 to 3; and the sum a+b is 3.

In the formula (1-6), $X_{63}$ represents any one selected from the group consisting of O, NR', S and CO.

In the formula (1-1), p11 represents an integer from 1 to 5.

In the formula (1-2), p21 and p22 each independently represent an integer from 1 to 4, and the sum of p21 and p22 does not exceed 5.

In the formula (1-3), p31 to p33 each independently represent an integer from 1 to 3, and the sum of p31 to p33 does not exceed 5.

In the formula (1-4), p41 represents an integer from 1 to 5.

In the formula (1-5), p51 and p52 each independently represent an integer from 1 to 5, and the sum of p51 and p52 does not exceed 9.

In the formula (1-6), p61 and p62 each independently represent an integer from 1 to 5, and the sum of p61 and p62 does not exceed 9.

In the formula (1-7), p71 and p73 each independently represent an integer from 1 to 5, p72 represents an integer from 1 to 2, and the sum of p71 to p73 does not exceed 9.

In the formula (1-8), p81 represents an integer from 1 to 4, p82 represents an integer from 1 to 3, and the sum of p81 and p82 does not exceed 6.

In the formula (1), A represents the following formula (2) or formula (3):

[Chemical Formula 2]

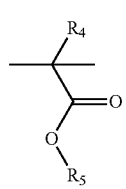

[Chemical Formula 3]

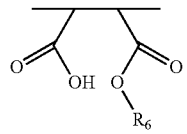

In the formula (2), $R_4$ represents any one selected from the group consisting of a hydrogen atom and an alkyl group having 1 to 10 carbon atoms, and may be any one selected from the group consisting of a hydrogen atom and an alkyl group having 1 to 5 carbon atoms.

In the formula (2), $R_5$ represents any one selected from the group consisting of a hydrogen atom, an alkyl group, a heteroalkyl group, a cycloalkyl group, a heterocycloalkyl group, an aryl group, a heteroaryl group, an arylalkyl group and a heteroarylalkyl group, and at least one hydrogen atom contained in $R_5$ is substituted by any one selected from the group consisting of a hydroxyl group, a carboxyl group, a halogen atom, a cyano group, a nitro group and combinations thereof.

In the formula (3), $R_6$ represents any one selected from the group consisting of a hydrogen atom, an alkyl group, a cycloalkyl group, a heteroalkyl group and a cycloheteroalkyl group, and may be any one selected from the group consisting of a hydrogen atom, an alkyl group having 1 to 6 carbon atoms, and a heteroalkyl group having 1 to 6 carbon atoms.

In the formula (1), m and n each represent the number of repeating units in the main chain, and they satisfy the following relations: m+n=1, 0.05<m/(m+n)<0.95, and 0.05<n/(m+n)<0.95.

When a structure represented by the formula (3) is contained in the copolymer for organic antireflective films containing a repeating unit represented by the above formula (1), a crosslinked structure can be formed, and the storage stability of the resin can be enhanced. The structure represented by the above formula (3) can be produced by a method including a process of ring-opening a polymer containing a dihydrofuran moiety into an alcohol.

The repeating unit represented by the above formula (1) increases the refractive index when contained in an organic antireflective film, and the antireflective film has a high refractive index particularly in the wavelength range around 193 nm, so that the organic antireflective film is particularly useful as an antireflective film in an ultrafine pattern forming lithography step using a 193-nm ArF excimer laser. Furthermore, hydrophilicity and hydrophobicity can be regulated, while the antireflective film has a high refractive index.

When a copolymer containing the repeating unit represented by the formula (1) is applied for the application of organic antireflective films, a crosslinked structure can be formed within one repeating unit, and the copolymer can still absorb light. Thus, a copolymer having appropriate reactivity can be synthesized by regulating the reactivity with a resist layer in the steps after the formation of the antireflective film, and the etching speed can be made fast.

The copolymer represented by the formula (1) may be any one selected from the group consisting of compounds represented by the following formulas (2-1) to (2-6):

[Chemical Formula 2-1]

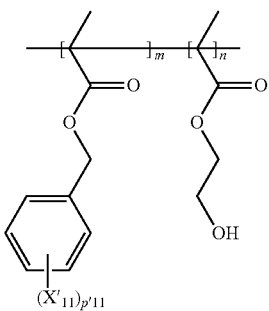

[Chemical Formula 2-2]

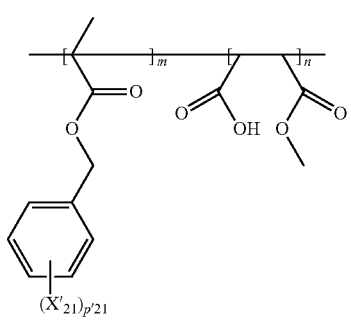

[Chemical Formula 2-3]

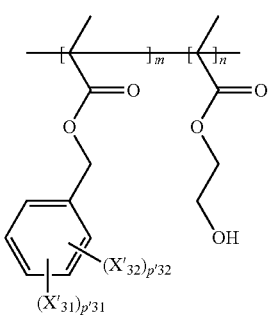

[Chemical Formula 2-4]

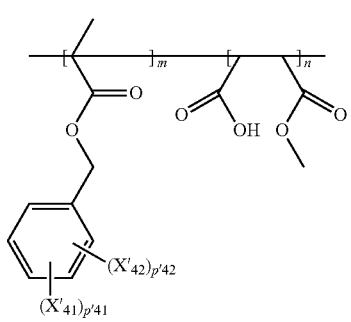

[Chemical Formula 2-5]

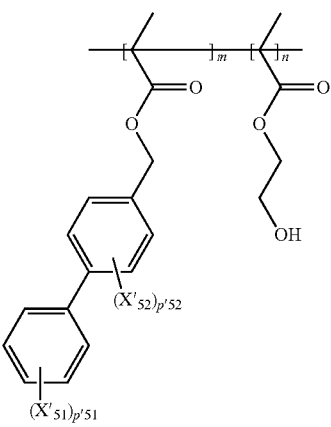

[Chemical Formula 2-6]

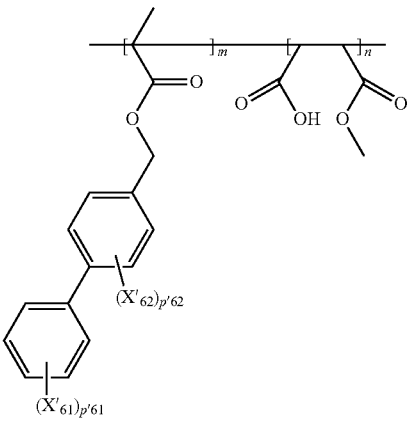

In the formulas (2-1) to (2-6), $X'_{11}$, $X'_{21}$, $X'_{31}$, $X'_{32}$, $X'_{41}$, $X'_{42}$, $X'_{51}$, $X'_{52}$, $X'_{61}$ and $X'_{62}$ each independently represent any one selected from the group consisting of a halogen atom, a perfluoroalkyl group, a cyano group, a nitro group and a phenyl group.

In the formulas (2-1) to (2-6), m and n satisfy the following relations: $m+n=1$, $0.05<(m/(m+n))<0.95$, and $0.05<n/(m+n)<0.95$.

In the formula (2-1) and the formula (2-2), p'11 and p'12 each independently represent an integer from 1 to 5.

In the formula (2-3) and the formula (2-4), p'31, p'32, p'41 and p'42 each independently represent an integer from 1 to 4, the sum of p'31 and p'32 does not exceed 5, and the sum of p'41 and p'42 does not exceed 5.

In the formula (2-5) and the formula (2-6), p'51 and p'61 each independently represent an integer from 1 to 5, and p'52 and p'62 each independently represent an integer from 1 to 4.

The copolymer of the formula (2) may be any one selected from the group consisting of compounds represented by the following formulas (3-1) to (3-10):

[Chemical Formula 3-1]
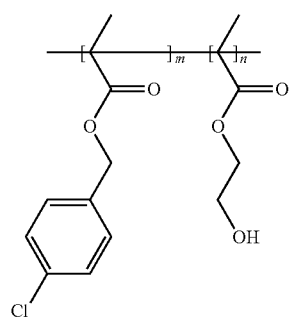
[Chemical Formula 3-2]
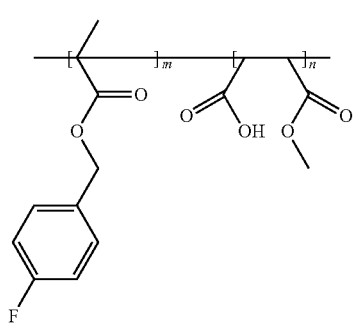
[Chemical Formula 3-3]
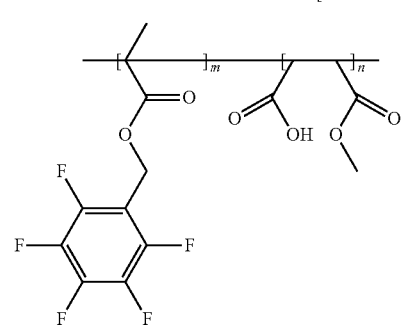
[Chemical Formula 3-4]
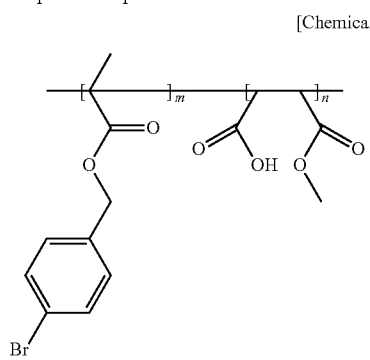
[Chemical Formula 3-5]
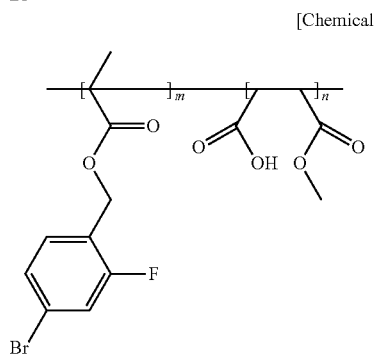
[Chemical Formula 3-6]
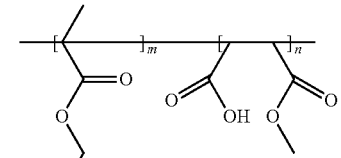
[Chemical Formula 3-7]
[Chemical Formula 3-8]
[Chemical Formula 3-9]
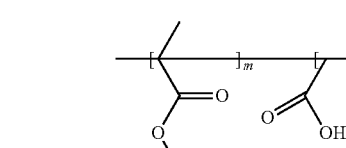

[Chemical Formula 3-10]

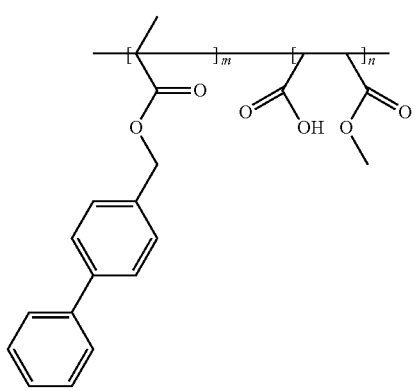

In the formulas (3-1) to (3-10), m and n satisfy the following relations: m+n=1, 0.05<m/(m+n)<0.95, and 0.05<n/(m+n)<0.95.

The copolymer contains both a moiety which serves as a light absorber and a moiety which is capable of reacting with a curing agent and thereby forming a crosslinked structure, and therefore, the copolymer is useful for organic antireflective films. Furthermore, when a crosslinked structure is formed via a curing process, the copolymer can have dissolution resistance to solvents, and the phenomenon in which the copolymer is dissolved in the solvent of the photoresist does not occur in the resist process, so that the copolymer can have stability. Furthermore, a polymer film which can be rapidly etched, and has hydrophilicity and hydrophobicity while having weak reactivity to resists can be formed. Thus, the copolymer can have excellent adhesive power to resists, and can also bring advantageous effects to the formation of resist patterns.

The copolymer for organic antireflective films can be a copolymer having a weight average molecular weight, as calculated relative to polystyrene standards, of 1,000 g/mol to 100,000 g/mol, and preferably 5,000 g/mol to 20,000 g/mol.

Also, the copolymer containing the repeating unit represented by the formula (1) can have its characteristics such as the extinction coefficient and the refractive index regulated by changing the proportions of the structures contained in the repeating units.

Preferably, in a copolymer for organic antireflective films containing the repeating unit represented by the formula (1), the repeating unit represented by the formula (1) may have a refractive index of 1.4 to 2.1. Furthermore, in the copolymer for organic antireflective films containing the repeating unit represented by the formula (1), the repeating unit represented by the formula (1) may have an extinction coefficient of 0.1 to 1.2, and preferably 0.45 to 1.2.

In the case of applying an organic antireflective film having an extinction coefficient in the range described above, the antireflection effect in the process of applying the above-described organic antireflective film can be enhanced.

The monomer for forming the copolymer for organic antireflective films according to another embodiment of the present invention is represented by the formula (1) shown above:

[Chemical Formula 1]

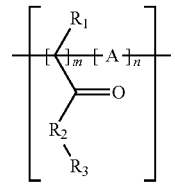

wherein in the formula (1), $R_1$ represents any one selected from the group consisting of a hydrogen atom, an alkyl group having 1 to 10 carbon atoms, and a heteroalkyl group having 1 to 6 carbon atoms; $R_2$ represents any one selected from the group consisting of CR'R", NR', O and S; R' and R" each independently represent any one selected from the group consisting of a hydrogen atom and an alkyl group having 1 to 5 carbon atoms; $R_3$ represents any one selected from the group consisting of an alkyl group, a heteroalkyl group, a cycloalkyl group, a heterocycloalkyl group, an aryl group, a heteroaryl group, an arylalkyl group, a heteroarylalkyl group, a vinylalkyl group and a heterovinylalkyl group; at least one hydrogen atom contained in $R_3$ is substituted by any one selected from the group consisting of a halogen atom, a cyano group, a nitro group, a phenyl group and combinations thereof; m and n satisfy the following relations: m+n=1, 0.05<m/(m+n)<0.95, and 0.05<n/(m+n)<0.95; and A represents by the following formula (2) or formula (3):

[Chemical Formula 2]

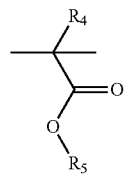

wherein in the formula (2), $R_4$ represents any one selected from the group consisting of a hydrogen atom and an alkyl group having 1 to 10 carbon atoms; $R_5$ represents any one selected from the group consisting of a hydrogen atom, an alkyl group, a heteroalkyl group, a cycloalkyl group, a heterocycloalkyl group, an aryl group, a heteroaryl group, an arylalkyl group and a heteroarylalkyl group; and at least one hydrogen atom contained in $R_5$ is substituted by any one selected from the group consisting of a hydroxyl group, a carboxyl group, a halogen atom, a cyano group, a nitro group and combinations thereof; and

[Chemical Formula 3]

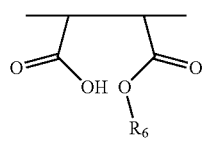

wherein in the formula (3), $R_6$ represents any one selected from the group consisting of a hydrogen atom, an alkyl group, a cycloalkyl group, a heteroalkyl group and a cycloheteroalkyl group.

Further specific description on the formula (1) overlaps with the description on the copolymer containing the repeating unit represented by the formula (1), and therefore, description thereof will not be repeated here.

The method for producing a monomer for forming an organic antireflective film, represented by the formula (1), may include a step of allowing a compound represented by the following formula (5-1) to react with a compound represented by any one selected from the group consisting of compounds represented by the following formula (5-2) and the following formula (5-3) in a polymerization solvent:

[Chemical Formula 5-1]

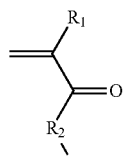

[Chemical Formula 5-2]

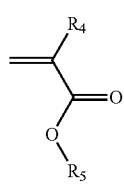

[Chemical Formula 5-3]

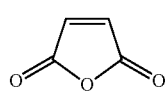

In the formulas (5-1) to (5-3), $R_1$, $R_2$, $R_3$, $R_4$ and $R_5$ have the same definitions as $R_1$, $R_2$, $R_3$, $R_4$ and $R_5$, respectively, and therefore, further descriptions will not be repeated here.

The polymerization solvent may be any one selected from the group consisting of dioxane, tetrahydrofuran, benzene, toluene, xylene, dimethylformamide, dimethyl sulfoxide, cyclohexanone, methyl ethyl ketone and combinations thereof.

The reaction can be achieved by adding a polymerization initiator, and the polymerization initiator may be any compound which is capable of initiating the synthesis reaction. However, preferably, the initiator may be any one selected from the group consisting of 2,2'-azobisisobutyronitrile, benzoyl peroxide, acetyl peroxide, lauryl peroxide, di-t-butyl peroxide, azobisvaleronitrile, t-butyl peracetate, 4-butyl hydroperoxide and combinations thereof.

The method for producing the monomer may include a solution preparing step of dissolving a compound represented by the formula (5-1) and any one compound selected from the group consisting of a compound represented by the formula (5-2) and a compound represented by the formula (5-3) in a polymerization solvent to prepare a solution 1, and dissolving an initiator in the polymerization solvent to prepare a solution 2; a reaction solution preparing step of heating the solution 2 to 60° C. to 180° C., and slowly adding the solution 1 dropwise to the heated solution 2 while stirring to prepare a solution 3; and a collecting step of cooling the solution 3, adding deionized water thereto, and thereby obtaining a precipitate.

In the reaction solution preparing step, heating can be carried out at 70° C. to 90° C., and the stirring can be carried out for 2 to 8 hours at 60° C. to 100° C.

The composition for organic antireflective films according to another embodiment of the present invention includes the copolymer described above.

The composition for organic antireflective films may include the copolymer in an amount of 0.1% to 99% by weight, preferably 0.5% to 40% by weight, and more preferably 1% to 20% by weight.

The composition for organic antireflective films may further include a solvent, and as the solvent, any one organic solvent selected from the group consisting of esters, ethers, lactones, ketones, amides, alcohols and combinations thereof can be used.

Specific examples of the solvent include ethylene glycol monomethyl ether, ethylene glycol monoethyl ether, propylene glycol monomethyl ether, propylene glycol monomethyl ether acetate, methyl cellosolve acetate, ethyl cellosolve acetate, diethylene glycol monomethyl ether, diethylene glycol monoethyl ether, cyclohexanone, ethyl lactate, propylene glycol, n-propyl ether, dimethylformamide, γ-butyrolactone, ethoxyethanol, methoxyethanol, methyl 3-methoxypropionate, ethyl 3-ethoxypropionate and combinations thereof.

The composition for organic antireflective films may further include a thermal acid generator, and the thermal acid generator may be any one selected from the group consisting of pyridinium p-toluenesulfonate and compounds represented by the following formulas (4-1) to (4-3):

[Chemical Formula 4-1]

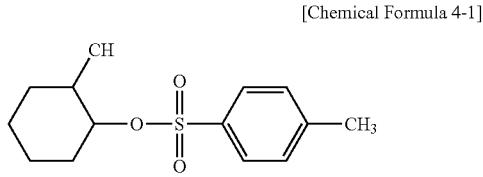

[Chemical Formula 4-2]

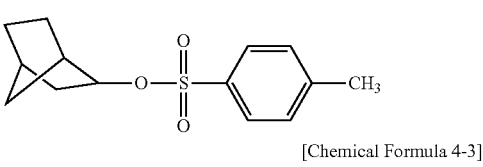

[Chemical Formula 4-3]

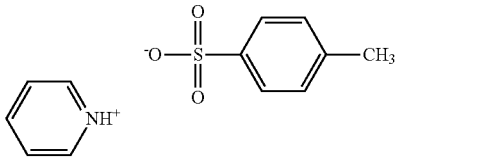

The thermal acid generator plays the role of accelerating the curing reaction at the time of forming an organic antireflective film, and for an appropriate curing reaction, the thermal acid generator may be incorporated into the composition for organic antireflective films in an amount of 0.01% to 30% by weight, and more preferably 0.01% to 20% by weight, based on the whole composition.

The composition for organic antireflective films of the present invention is prepared by dissolving the copolymer and the thermal acid generator in a solvent, and filtering the solution through a membrane filter, and an organic antireflective film can be formed by applying the composition on a substrate such as a silicon wafer and baking the composition.

The application can be carried out by applying any coating method used in conventional resist processes, such as spin coating, and the baking process can be carried out at 100° C. to 400° C. for 10 to 300 seconds.

The organic antireflective film formed by using the composition for organic antireflective film has high refraction characteristics in the wavelength range around 193 nm, and is thus useful as a bottom-antireflective coating (BARC) in the process of exposure using an ArF excimer laser in the wavelength range described above.

The light absorber for organic antireflective films, a copolymer for organic antireflective films, and a composition including the copolymer provided by the present invention have an enhanced refractive index and are highly effective when an antireflective film is produced therefrom. Also, an organic antireflective film in which hydrophilicity and hydrophobicity of the coating film can be regulated, and which has excellent compatibility with resists can be obtained, and since the organic antireflective film has high refraction characteristics particularly in the wavelength range around 193 nm, the organic antireflective film is useful as a bottom-antireflective coating (BARC) in the process of exposure using an ArF excimer laser in the wavelength range described above.

EXAMPLES

Hereinafter, the present invention will be described in detail by way of Examples so that those having ordinary skill in the art can easily carry out the present invention. However, the present invention can be carried out in various different embodiments, and is not intended to be limited to the Examples described below.

Synthesis Examples of Polymer for Organic Antireflective Films

Synthesis Example 1

50 g of 4-chlorobenzyl methacrylate and 30.88 g of 2-hydroxyethyl methacrylate were dissolved in 50 g of dioxane, and thus a solution 1-1 was prepared. 4.04 g of 2,2'-azobisisobutyronitrile was dissolved in 242 g of dioxane, and the solution was heated to 80° C. to thereby prepare a solution 1-2. When the temperature of the solution 1-2 reached 75° C., the solution 1-1 was slowly added dropwise to the heated solution 1-2 for 1.5 hours, and the mixture was stirred for 4 hours to thus prepare a solution 1-3. The stirred solution 1-3 was cooled to normal temperature (25° C.), and then deionized water was added thereto in an amount of 8-fold the volume of the solution 1-3. Thus, a precipitate was obtained therefrom. The precipitate was dried in a vacuum oven for 24 hours, and thus a compound of the formula (3-1) was obtained.

Synthesis Example 2

50 g of 4-fluorobenzyl methacrylate and 25.24 g of maleic anhydride were dissolved in 50 g of dioxane, and thus a solution 2-1 was prepared. 3.76 g of 2,2'-azobisisobutyronitrile was dissolved in 225 g of dioxane, and the solution was heated to 80° C. to thereby prepare a solution 2-2. When the temperature of the solution 2-2 reached 75° C., the solution 2-1 was slowly added dropwise to the heated solution 2-2 for 1.5 hours, and the mixture was stirred for 4 hours to thus prepare a solution 2-3. The stirred solution 2-3 was cooled to normal temperature (25° C.), and then deionized water was added thereto in an amount of 8-fold the volume of the solution 2-3. Thus, a precipitate was obtained therefrom. The precipitate was dried in a vacuum oven for 24 hours, and thus a compound of the formula (3-2) was obtained. The structure of the compound of the formula (3-2) produced as described above was confirmed by NMR, and the analysis results are presented in FIG. 1.

Synthesis Example 3

50 g of 2,3,4,5,6-pentafluorobenzyl methacrylate and 18.42 g of maleic anhydride were dissolved in 50 g of dioxane, and thus a solution 3-1 was prepared. 3.42 g of 2,2'-azobisisobutyronitrile was dissolved in 205 g of dioxane, and the solution was heated to 80° C. to thereby prepare a solution 3-2. When the temperature of the solution 3-2 reached 75° C., the solution 3-1 was slowly added dropwise to the heated solution 3-2 for 1.5 hours, and the mixture was stirred for 4 hours to thus prepare a solution 3-3. The stirred solution 3-3 was cooled to normal temperature (25° C.), and then deionized water was added thereto in an amount of 8-fold the volume of the solution 3-3. Thus, a precipitate was obtained therefrom. The precipitate was dried in a vacuum oven for 24 hours, and thus a compound of the formula (3-3) was obtained.

Synthesis Example 4

50 g of 4-bromobenzyl methacrylate and 19.21 g of maleic anhydride were dissolved in 50 g of dioxane, and thus a solution 4-1 was prepared. 3.46 g of 2,2'-azobisisobutyronitrile was dissolved in 207 g of dioxane, and the solution was heated to 80° C. to thereby prepare a solution 4-2. When the temperature of the solution 4-2 reached 75° C., the solution 4-1 was slowly added dropwise to the heated solution 4-2 for 1.5 hours, and the mixture was stirred for 4 hours to thus prepare a solution 4-3. The stirred solution 4-3 was cooled to normal temperature (25° C.), and then deionized water was added thereto in an amount of 8-fold the volume of the solution 4-3. Thus, a precipitate was obtained therefrom. The precipitate was dried in a vacuum oven for 24 hours, and thus a compound of the formula (3-4) was obtained.

Synthesis Example 5

50 g of 2-fluoro-4-bromobenzyl methacrylate and 17.95 g of maleic anhydride were dissolved in 50 g of dioxane, and thus a solution 5-1 was prepared. 3.4 g of 2,2'-azobisisobutyronitrile was dissolved in 203 g of dioxane, and the solution was heated to 80° C. to thereby prepare a solution 5-2. When the temperature of the solution 5-2 reached 75° C., the solution 5-1 was slowly added dropwise to the heated solution 5-2 for 1.5 hours, and the mixture was stirred for 4 hours to thus prepare a solution 5-3. The stirred solution 5-3 was cooled to normal temperature (25° C.), and then deionized water was added thereto in an amount of 8-fold the volume of the solution 5-3. Thus, a precipitate was obtained therefrom. The precipitate was dried in a vacuum oven for 24 hours, and thus a compound of the formula (3-5) was obtained.

Synthesis Example 6

50 g of 4-chlorobenzyl methacrylate and 23.27 g of maleic anhydride were dissolved in 50 g of dioxane, and thus a solution 6-1 was prepared. 3.66 g of 2,2'-azobisisobutyronitrile was dissolved in 219 g of dioxane, and the solution was heated to 80° C. to thereby prepare a solution 6-2. When the temperature of the solution 6-2 reached 75° C., the solution 6-1 was slowly added dropwise to the heated solution 6-2 for 1.5 hours, and the mixture was stirred for 4 hours to thus prepare a solution 6-3. The stirred solution 6-3 was cooled to normal temperature (25° C.), and then deionized water was added thereto in an amount of 8-fold the volume of the solution 6-3. Thus, a precipitate was obtained therefrom. The precipitate was dried in a vacuum oven for 24 hours, and thus a compound of the formula (3-6) was obtained.

Synthesis Example 7

50 g of 4-trifluoromethylbenzyl methacrylate and 23.27 g of maleic anhydride were dissolved in 50 g of dioxane, and thus a solution 7-1 was prepared. 3.66 g of 2,2'-azobisisobutyronitrile was dissolved in 219 g of dioxane, and the solution was heated to 80° C. to thereby prepare a solution 7-2. When the temperature of the solution 7-2 reached 75° C., the solution 7-1 was slowly added dropwise to the heated solution 7-2 for 1.5 hours, and the mixture was stirred for 4 hours to thus prepare a solution 7-3. The stirred solution 7-3 was cooled to normal temperature (25° C.), and then deionized water was added thereto in an amount of 8-fold the volume of the solution 7-3. Thus, a precipitate was obtained therefrom. The precipitate was dried in a vacuum oven for 24 hours, and thus a compound of the formula (3-7) was obtained.

Synthesis Example 8

50 g of 4-cyanobenzyl methacrylate and 24.36 g of maleic anhydride were dissolved in 50 g of dioxane, and thus a solution 8-1 was prepared. 3.71 g of 2,2'-azobisisobutyronitrile was dissolved in 223 g of dioxane, and the solution was heated to 80° C. to thereby prepare a solution 8-2. When the temperature of the solution 8-2 reached 75° C., the solution 8-1 was slowly added dropwise to the heated solution 8-2 for 1.5 hours, and the mixture was stirred for 4 hours to thus prepare a solution 8-3. The stirred solution 8-3 was cooled to normal temperature (25° C.), and then deionized water was added thereto in an amount of 8-fold the volume of the solution 8-3. Thus, a precipitate was obtained therefrom. The precipitate was dried in a vacuum oven for 24 hours, and thus a compound of the formula (3-8) was obtained.

Synthesis Example 9

Figure 2:
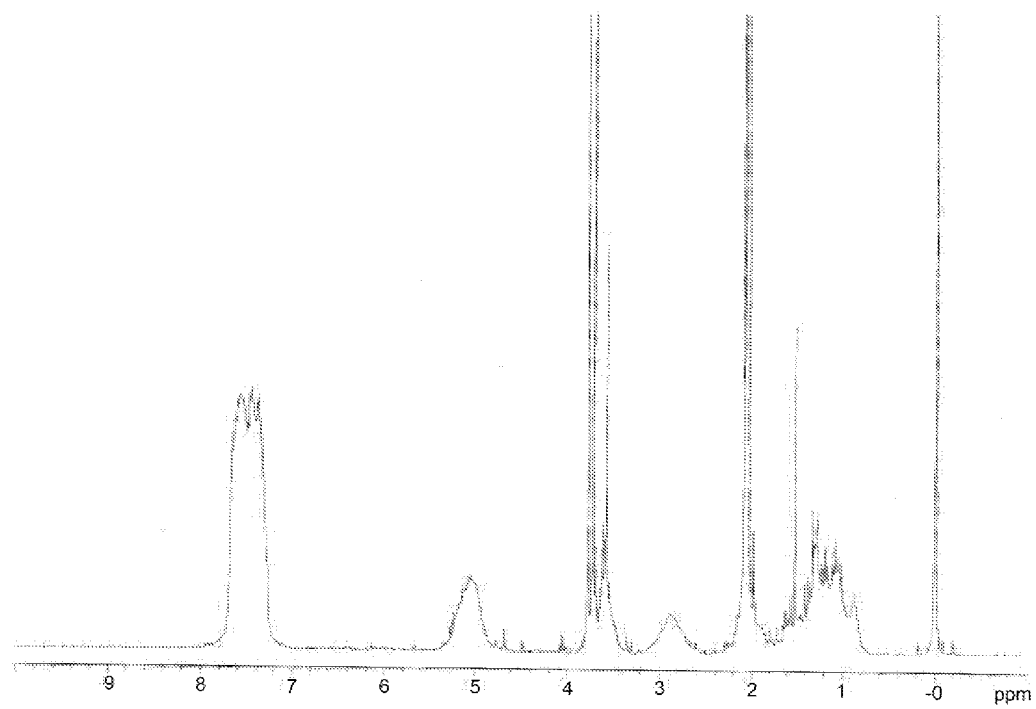
FIG. 2 is a diagram showing the NMR data of the compound represented by formula (3-9) obtained in Synthesis Example 9.

50 g of 4-cyanobenzyl methacrylate and 22.16 g of maleic anhydride were dissolved in 50 g of dioxane, and thus a solution 9-1 was prepared. 3.6 g of 2,2'-azobisisobutyronitrile was dissolved in 216 g of dioxane, and the solution was heated to 80° C. to thereby prepare a solution 9-2. When the temperature of the solution 9-2 reached 75° C., the solution 9-1 was slowly added dropwise to the heated solution 9-2 for 1.5 hours, and the mixture was stirred for 4 hours to thus prepare a solution 9-3. The stirred solution 9-3 was cooled to normal temperature (25° C.), and then deionized water was added thereto in an amount of 8-fold the volume of the solution 9-3. Thus, a precipitate was obtained therefrom. The precipitate was dried in a vacuum oven for 24 hours, and thus a compound of the formula (3-9) was obtained. The structure of the compound of formula (3-9) produced as described above was confirmed by NMR, and the measurement results are presented in FIG. 2.

Synthesis Example 10

Figure 3:
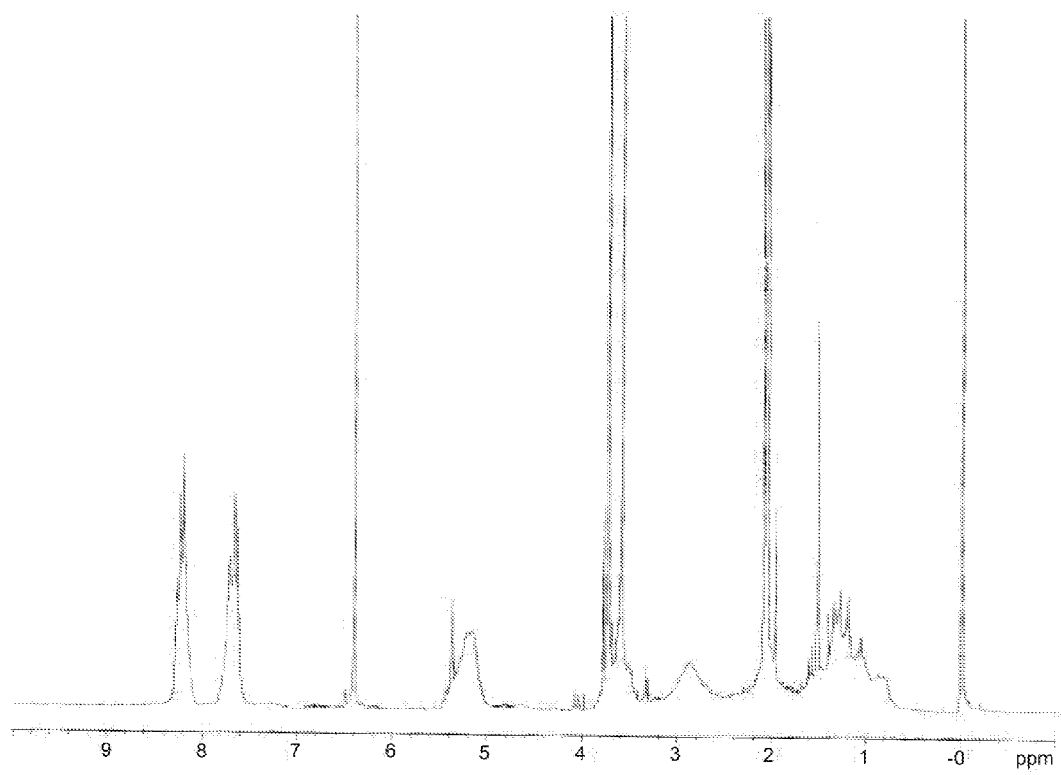
FIG. 3 is a diagram showing the NMR data of the compound represented by formula (3-10) obtained in Synthesis Example 10.

50 g of 4-biphenyl methacrylate and 19.43 g of maleic anhydride were dissolved in 50 g of dioxane, and thus a solution 10-1 was prepared. 3.47 g of 2,2'-azobisisobutyronitrile was dissolved in 208 g of dioxane, and the solution was heated to 80° C. to thereby prepare a solution 10-2. When the temperature of the solution 10-2 reached 75° C., the solution 10-1 was slowly added dropwise to the heated solution 10-2 for 1.5 hours, and the mixture was stirred for 4 hours to thus prepare a solution 10-3. The stirred solution 10-3 was cooled to normal temperature (25° C.), and then deionized water was added thereto in an amount of 8-fold the volume of the solution 10-3. Thus, a precipitate was obtained therefrom. The precipitate was dried in a vacuum oven for 24 hours, and thus a compound of the formula (3-10) was obtained. The structure of the compound of formula (3-10) produced as described above was confirmed by NMR, and the measurement results are presented in FIG. 3.

Preparation of Organic Antireflective Film Composition

Preparation Example 1

15 g of the polymer for organic antireflective films produced in Synthesis Example 1 described above, 4 g of tetramethoxymethyl glycoluril and 1 g of pyridinium p-toluenesulfonate were dissolved in 980 g of propylene glycol monomethyl ether acetate, and then the solution was filtered through a membrane filter having a pore diameter of 0.2 μm. Thus, an organic antireflective film composition was prepared.

Preparation Example 2

15 g of the polymer for organic antireflective films produced in Synthesis Example 2 described above, 4 g of tetramethoxymethyl glycoluril and 1 g of the thermal acid generator of the formula (4-1) were dissolved in 980 g of ethyl lactate, and then the solution was filtered through a membrane filter having a pore diameter of 0.2 μm. Thus, an organic antireflective film composition was prepared.

Preparation Example 3

15 g of the polymer for organic antireflective films produced in Synthesis Example 3 described above, 4 g of tetramethoxymethyl glycoluril and 1 g of the thermal acid generator of the formula (4-2) were dissolved in 980 g of propylene glycol monomethyl ether acetate, and then the solution was filtered through a membrane filter having a pore diameter of 0.2 μm. Thus, an organic antireflective film composition was prepared.

Preparation Example 4

15 g of the polymer for organic antireflective films produced in Synthesis Example 4 described above, 4 g of tetramethoxymethyl glycoluril and 1 g of pyridinium p-toluenesulfonate were dissolved in 980 g of propylene glycol monomethyl ether acetate, and then the solution was filtered through a membrane filter having a pore diameter of 0.2 μm. Thus, an organic antireflective film composition was prepared.

Preparation Example 5

15 g of the polymer for organic antireflective films produced in Synthesis Example 5 described above, 4 g of tetramethoxymethyl glycoluril and 1 g of the thermal acid generator of the formula (4-3) were dissolved in 980 g of propylene glycol monomethyl ether acetate, and then the solution was filtered through a membrane filter having a pore diameter of 0.2 μm. Thus, an organic antireflective film composition was prepared.

Preparation Example 6

15 g of the polymer for organic antireflective films produced in Synthesis Example 6 described above, 4 g of tetramethoxymethyl glycoluril and 1 g of pyridinium p-toluenesulfonate were dissolved in 980 g of propylene glycol monomethyl ether acetate, and then the solution was filtered through a membrane filter having a pore diameter of 0.2 μm. Thus, an organic antireflective film composition was prepared.

Preparation Example 7

15 g of the polymer for organic antireflective films produced in Synthesis Example 7 described above, 4 g of tetramethoxymethyl glycoluril and 1 g of the thermal acid generator of the formula (4-1) were dissolved in 980 g of ethyl lactate, and then the solution was filtered through a membrane filter having a pore diameter of 0.2 μm. Thus, an organic antireflective film composition was prepared.

Preparation Example 8

15 g of the polymer for organic antireflective films produced in Synthesis Example 8 described above, 4 g of tetramethoxymethyl glycoluril and 1 g of the thermal acid generator of the formula (4-2) were dissolved in 980 g of propylene glycol monomethyl ether acetate, and then the solution was filtered through a membrane filter having a pore diameter of 0.2 μm. Thus, an organic antireflective film composition was prepared.

Preparation Example 9

15 g of the polymer for organic antireflective films produced in Synthesis Example 9 described above, 4 g of tetramethoxymethyl glycoluril and 1 g of pyridinium p-toluenesulfonate were dissolved in 980 g of propylene glycol monomethyl ether acetate, and then the solution was filtered through a membrane filter having a pore diameter of 0.2 μm. Thus, an organic antireflective film composition was prepared.

Preparation Example 10

15 g of the polymer for organic antireflective films produced in Synthesis Example 10 described above, 4 g of tetramethoxymethyl glycoluril and 1 g of the thermal acid generator of the formula (4-3) were dissolved in 980 g of propylene glycol monomethyl ether acetate, and then the solution was filtered through a membrane filter having a pore diameter of 0.2 p.m. Thus, an organic antireflective film composition was prepared.

The compositions and contents of the organic antireflective film compositions of Examples 1 to 10 are summarized in the following Table 1.

Evaluation of Properties of Organic Antireflective Film (Stripping Test)

Each of the organic antireflective film composition prepared in Examples 1 to 10 described above was spin coated on a silicon wafer, and then the wafer was baked on a hot plate heated to 230° C. for one minute. Thus, an organic antireflective film was formed, and the thickness of the film was measured (Measurement 1).

The wafer coated with the organic antireflective film was immersed in ethyl lactate for one minute, and then ethyl lactate was completely removed. The wafer was baked on a hot plate heated to 100° C. for one minute, and then the thickness of the organic antireflective film was measured again (Measurement 2).

The results of the Measurement 1 and the Measurement 2 were compared, and it was found that there was no change in the thickness of the films formed in Examples 1 to 10 before and after the ethyl lactate treatment.

From the results described above, it was confirmed that the organic antireflective film compositions prepared in Examples 1 to 10 of the present invention were completely cured during the baking process, and intermixing with photoresists and the like do not occur in the course of the lithography process.

(Measurement of Values of Refractive Index (n) and Extinction Coefficient (k))

Each of the organic antireflective film compositions prepared in Example 1 to Example 10 was spin coated on a silicon wafer, and then the wafer was baked on a hot plate at 230° C. for one minute. Thus, a crosslinked organic antireflective film was formed. For each of the organic antireflective films, the refractive index (n) at 193 nm and the extinction coefficient (k) were measured using a spectroscopic ellipsometer (J.A. Woollam Co.). The results are presented in the following Table 2.

TABLE 1

|  | Polymer for organic antireflective film | Preparation of composition | Light absorber | TMMG | TAG | Solvent |
| --- | --- | --- | --- | --- | --- | --- |
| Example 1 | Synthesis Example 1 | Preparation Example 1 | 1.50 | 0.40 | 0.10 | 98.00 |
| Example 2 | Synthesis Example 2 | Preparation Example 2 | 1.50 | 0.40 | 0.10 | 98.00 |
| Example 3 | Synthesis Example 3 | Preparation Example 3 | 1.50 | 0.40 | 0.10 | 98.00 |
| Example 4 | Synthesis Example 4 | Preparation Example 4 | 1.50 | 0.40 | 0.10 | 98.00 |
| Example 5 | Synthesis Example 5 | Preparation Example 5 | 1.50 | 0.40 | 0.10 | 98.00 |
| Example 6 | Synthesis Example 6 | Preparation Example 6 | 1.50 | 0.40 | 0.10 | 98.00 |
| Example 7 | Synthesis Example 7 | Preparation Example 7 | 1.50 | 0.40 | 0.10 | 98.00 |
| Example 8 | Synthesis Example 8 | Preparation Example 8 | 1.50 | 0.40 | 0.10 | 98.00 |
| Example 9 | Synthesis Example 9 | Preparation Example 9 | 1.50 | 0.40 | 0.10 | 98.00 |
| Example 10 | Synthesis Example 10 | Preparation Example 10 | 1.50 | 0.40 | 0.10 | 98.00 |

(Content: parts by weight)
*TMMG: Tetramethoxymethyl glycoluril, TAG: Thermal acid generator

TABLE 2

| | Refractive index (n) | Extinction coefficient (k) |
|---|---|---|
| Example 1 | 1.901 | 0.271 |
| Example 2 | 1.953 | 0.351 |
| Example 3 | 1.897 | 0.322 |
| Example 4 | 1.925 | 0.286 |
| Example 5 | 1.932 | 0.366 |
| Example 6 | 1.973 | 0.312 |
| Example 7 | 1.926 | 0.271 |
| Example 8 | 1.981 | 0.255 |
| Example 9 | 1.884 | 0.288 |
| Example 10 | 1.928 | 0.312 |

According to the above Table 2, it was confirmed that the organic antireflective films formed in Examples 1 to 10 have refractive indices and extinction coefficients that are appropriate to be applied to a lithography process at 193 nm.

Photoresist Pattern Formation and Evaluation

Each of the organic antireflective film compositions prepared in Examples 1 to 10 described above was spin coated on a silicon wafer, and then the wafer was baked on a hot plate heated to 230° C. for one minute. Thus, an organic antireflective film was formed.

An ArF photoresist was applied on top of the organic antireflective film, and then the silicon wafer was baked at 110° C. for 90 seconds. After the baking, the photoresist was exposed using a scanner facility, and the wafer was baked again at 110° C. for 90 seconds. The exposed wafer was developed using a developer solution containing 2.38 wt % of TMAH, and thus a final photoresist pattern could be obtained. The pattern was an L/S (Line-Space) pattern having a size of 80 nm.

The pattern form described below was determined by visual inspection on whether the undercut phenomenon, the footing phenomenon and the like are observed.

The energy margin described below was evaluated on the basis of 10% of the pattern size, and a higher number indicates a superior process margin.

The focus depth margin described below was measured on the basis of 10% of the pattern size, and a higher focus depth margin indicates a superior process margin.

TABLE 3

| | Pattern size (L/S) | Pattern form | Energy margin (%) | Focus depth margin (μm) |
|---|---|---|---|---|
| Example 1 | 80 nm | Good | 8.1 | 0.3 |
| Example 2 | 80 nm | Good | 10.5 | 0.25 |
| Example 3 | 80 nm | Good | 9.3 | 0.25 |
| Example 4 | 80 nm | Good | 9.2 | 0.3 |
| Example 5 | 80 nm | Good | 11 | 0.3 |
| Example 6 | 80 nm | Good | 9.6 | 0.3 |
| Example 7 | 80 nm | Good | 9.1 | 0.25 |
| Example 8 | 80 nm | Good | 8.3 | 0.25 |
| Example 9 | 80 nm | Good | 8.5 | 0.3 |
| Example 10 | 80 nm | Good | 11.3 | 0.3 |

According to the Table 3, it was confirmed that the antireflective films obtained from the organic antireflective film compositions of the present invention can provide sufficiently broad energy margins and focus depth margins. Furthermore, patterns having an excellent vertical form without any undercut, footing and the like observed thereon could be obtained.

Preferred embodiments of the present invention have been described in detail in the above, but the scope of the invention is not limited to the specific details and representative embodiments shown and described herein. Accordingly, various modifications may be made without departing from the spirit or scope of the general inventive concept as defined by the appended claims and their equivalents.

What is claimed is:

1. A copolymer for organic antireflective films, comprising a repeating unit represented by the following formula (1):

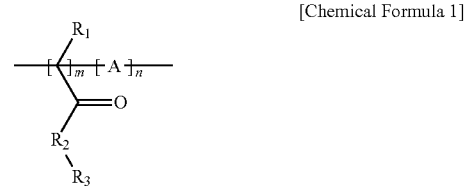

[Chemical Formula 1]

wherein in the formula (1), $R_1$ represents any one selected from the group consisting of a hydrogen atom, an alkyl group having 1 to 10 carbon atoms, and a heteroalkyl group having 1 to 6 carbon atoms;

$R_2$ represents any one selected from the group consisting of CR'R", NR', O and S; R' and R" each independently represent any one selected from the group consisting of a hydrogen atom and an alkyl group having 1 to 5 carbon atoms;

$R_3$ is any one selected from the group consisting of groups represented by the following formulas (1-1) to (1-8):

m and n satisfy the following relations: m+n=1, 0.05<m/(m+n)<0.95, and 0.05<n/(m+n)<0.95; and A represents the following formula (2) or formula (3):

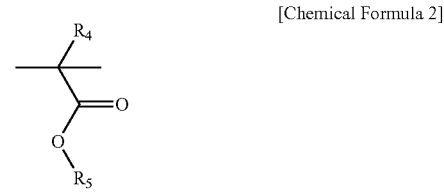

[Chemical Formula 2]

wherein in the formula (2), $R_4$ represents any one selected from the group consisting of a hydrogen atom and an alkyl group having 1 to 10 carbon atoms;

$R_5$ represents any one selected from the group consisting of a hydrogen atom, an alkyl group, a heteroalkyl group, a cycloalkyl group, a heterocycloalkyl group, an aryl group, a heteroaryl group, an arylalkyl group and a heteroarylalkyl group, and at least one hydrogen atom contained in $R_5$ is substituted by any one selected from the group consisting of a hydroxyl group, a carboxyl group, a halogen atom, a cyano group, a nitro group and combinations thereof; and

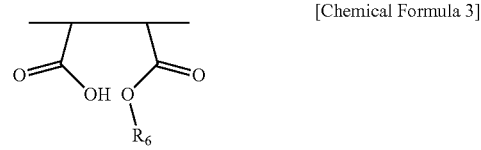

[Chemical Formula 3]

wherein in the formula (3), $R_6$ represents any one selected from the group consisting of a hydrogen atom, an alkyl group, a cycloalkyl group, a heteroalkyl group and a cycloheteroalkyl group

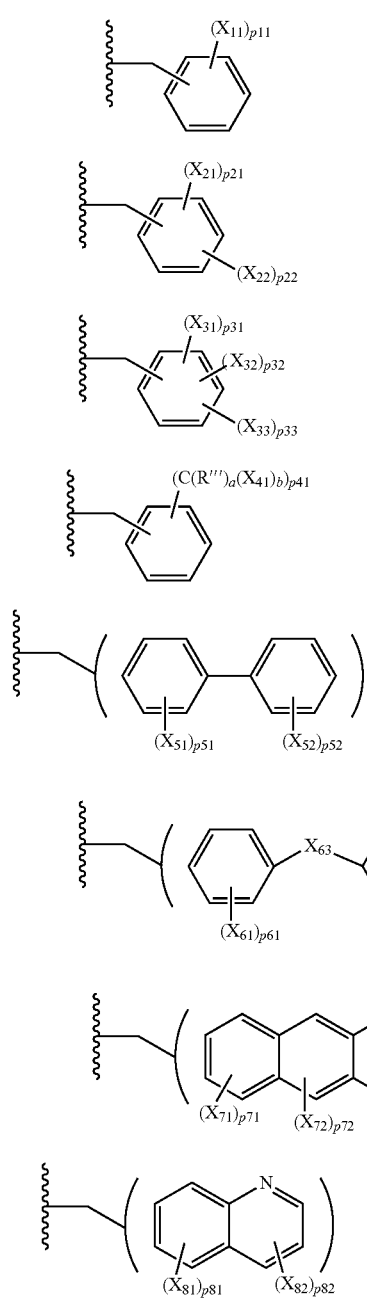

[Chemical Formula 1-1]

[Chemical Formula 1-2]

[Chemical Formula 1-3]

[Chemical Formula 1-4]

[Chemical Formula 1-5]

[Chemical Formula 1-6]

[Chemical Formula 1-7]

[Chemical Formula 1-8]

wherein in the formulas (1-1) to (1-8), $X_{11}$, $X_{21}$, $X_{22}$, $X_{31}$, $X_{32}$, $X_{33}$, $X_{51}$, $X_{52}$, $X_{61}$, $X_{62}$, $X_{71}$, $X_{72}$, $X_{73}$, $X_{81}$ and $X_{82}$ each independently represent any one selected from the group consisting of a halogen atom, a cyano group, a nitro group, a phenyl group and perfluoroalkyl group;

R''' represents any one selected from the group consisting of a hydrogen atom and a methyl group; $X_{41}$ represents a halogen atom; a represents an integer from 1 to 3; b represents an integer from 1 to 3, the sum a+b is 3;

$X_{63}$ represents any one selected from the group consisting of O, NR', S and CO;

p11 represents an integer from 1 to 5;

p21 and p22 each independently represent an integer from 1 to 4, the sum of p21 and p22 does not exceed 5;

p31 to p33 each independently represent an integer from 1 to 3, the sum of p31 to p33 does not exceed 5;

p41 represents an integer from 1 to 5;

p51 and p52 each independently represent an integer from 1 to 5, the sum of p51 and p52 does not exceed 9;

p61 and p62 each independently represent an integer from 1 to 5, the sum of p61 and p62 does not exceed 9;

p71 and p73 each independently represent an integer from 1 to 5, p72 represents an integer from 1 to 2, the sum of p71 to p73 does not exceed 9;

p81 represents an integer from 1 to 4; p82 represents an integer from 1 to 3; and the sum of p81 and p82 does not exceed 6, and wherein the copolymer has a weight-average molecular weight as calculated relative to polystyrene standards of 5,000 g/mol to 20,000 g/mol.

2. A copolymer for organic antireflective films comprising any one selected from the group consisting of repeating units represented by the following formulas (2-1) to (2-6):

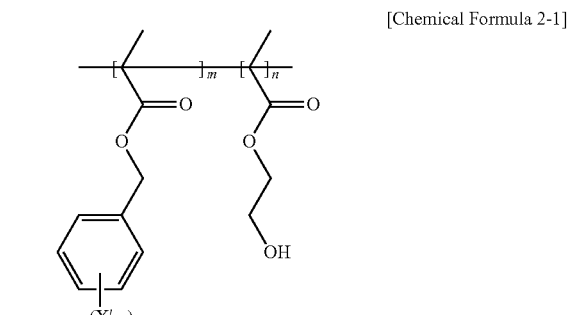

[Chemical Formula 2-1]

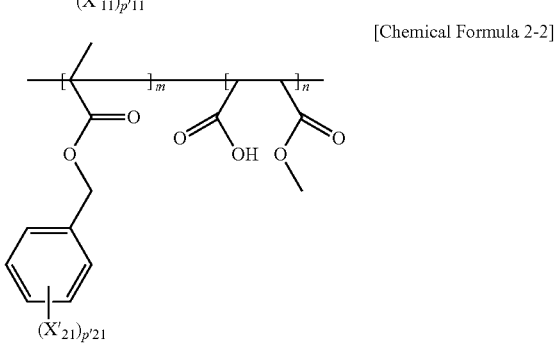

[Chemical Formula 2-2]

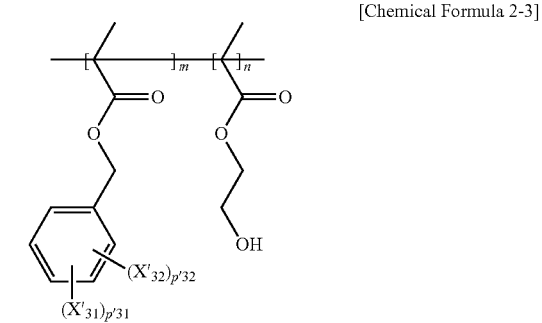

[Chemical Formula 2-3]

-continued

[Chemical Formula 2-4]

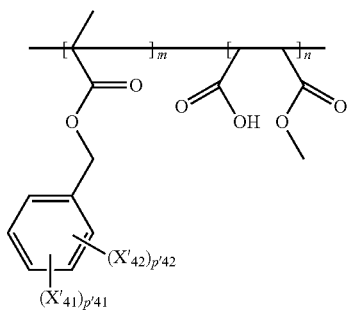

[Chemical Formula 2-5]

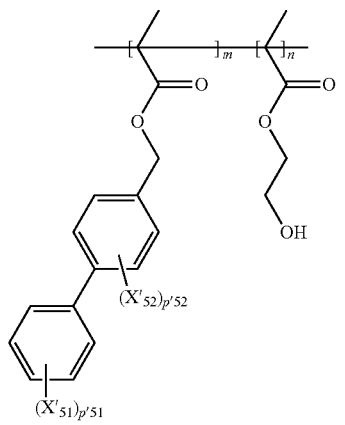

[Chemical Formula 2-6]

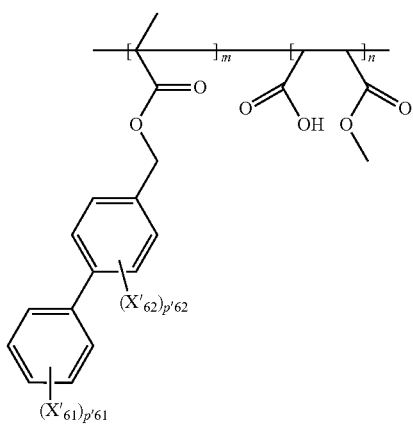

wherein in the formulas (2-1) to (2-6), $X'_{11}$, $X'_{21}$, $X'_{31}$, $X'_{32}$, $X'_{41}$, $X'_{42}$, $X'_{51}$, $X'_{52}$, $X'_{61}$ and $X'_{62}$ each independently represent any one selected from the group consisting of a halogen atom, a perfluoroalkyl group, a cyano group, a nitro group and a phenyl group;

m and n satisfy the following relations: $m+n=1$, $0.05<m/(m+n)<0.95$, and $0.05<n/(m+n)<0.95$;

p'11 and p'12 each independently represent an integer from 1 to 5;

p'31, p'32, p'41 and p'42 each independently represent an integer from 1 to 4, the sum of p'31 and p'32 does not exceed 5; the sum of p'41 and p'42 does not exceed 5;

p'51 and p'61 each independently represent an integer from 1 to 5; and p'52 and p'62 each independently represent an integer from 1 to 4.

3. A composition for organic antireflective films, comprising a copolymer having a repeating unit represented by the following formula (1):

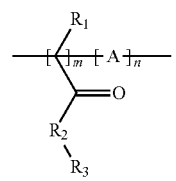

wherein in the formula (1), $R_1$ represents any one selected from the group consisting of a hydrogen atom, an alkyl group having 1 to 10 carbon atoms, and a heteroalkyl group having 1 to 6 carbon atoms; $R_2$ represents any one selected from the group consisting of CR'R'', NR', O and S; R' and R'' each independently represent any one selected from the group consisting of a hydrogen atom and an alkyl group having 1 to 5 carbon atoms; $R_3$ is any one selected from the group consisting of groups represented by the following formulas (1-1) to (1-8); m and n satisfy the following relations: $m+n=1$, $0.05<m/(m+n)<0.95$, and $0.05<n/(m+n)<0.95$; and A represents the following formula (2) or formula (3):

[Chemical Formula 2]

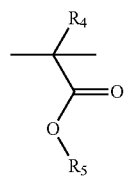

wherein in the formula (2), $R_4$ represents any one selected from the group consisting of a hydrogen atom and an alkyl group having 1 to 10 carbon atoms; $R_5$ represents any one selected from the group consisting of a hydrogen atom, an alkyl group, a heteroalkyl group, a cycloalkyl group, a heterocycloalkyl group, an aryl group, a heteroaryl group, an arylalkyl group and a heteroarylalkyl group, and at least one hydrogen atom contained in $R_5$ is substituted by any one selected from the group consisting of a hydroxyl group, a carboxyl group, a halogen atom, a cyano group, a nitro group and combinations thereof;

[Chemical Formula 3]

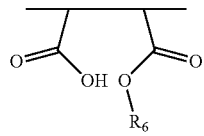

wherein in the formula (3), $R_6$ represents any one selected from the group consisting of a hydrogen atom, an alkyl group, a cycloalkyl group, a heteroalkyl group and a cycloheteroalkyl group;

[Chemical Formula 1-1]

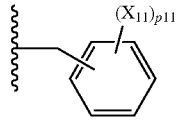

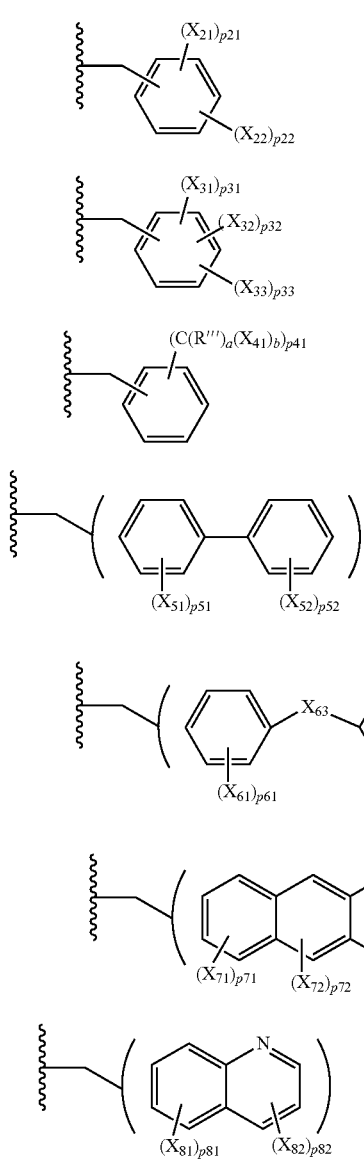

wherein in the formulas (1-1) to (1-8), $X_{11}$, $X_{21}$, $X_{22}$, $X_{31}$, $X_{32}$, $X_{33}$, $X_{51}$, $X_{52}$, $X_{61}$, $X_{62}$, $X_{71}$, $X_{72}$, $X_{73}$, $X_{81}$ and $X_{82}$ each independently represent any one selected from the group consisting of a halogen atom, a cyano group, a nitro group and a phenyl group;

R''' represents any one selected from the group consisting of a hydrogen atom and a methyl group; $X_{41}$ represents a halogen atom; a represents an integer from 1 to 3; b represents an integer from 1 to 3, the sum a+b is 3;

$X_{63}$ represents any one selected from the group consisting of O, NR', S and CO;

p11 represents an integer from 1 to 5;

p21 and p22 each independently represent an integer from 1 to 4, the sum of p21 and p22 does not exceed 5;

p31 to p33 each independently represent an integer from 1 to 3, the sum of p31 to p33 does not exceed 5;

p41 represents an integer from 1 to 5;

p51 and p52 each independently represent an integer from 1 to 5, the sum of p51 and p52 does not exceed 9;

p61 and p62 each independently represent an integer from 1 to 5, the sum of p61 and p62 does not exceed 9;

p71 and p73 each independently represent an integer from 1 to 5, p72 represents an integer from 1 to 2, the sum of p71 to p73 does not exceed 9;

p81 represents an integer from 1 to 4; p82 represents an integer from 1 to 3; and the sum of p81 and p82 does not exceed 6.

4. A composition for organic antireflective films, comprising the copolymer according to claim 2.

5. The copolymer for organic antireflective films according to claim 2, wherein the copolymer for organic antireflective films has a weight average molecular weight as calculated relative to polystyrene standards of 1,000 g/mol to 100,000 g/mol.

6. The composition for organic antireflective films according to claim 3, wherein the copolymer for organic antireflective films has a weight average molecular weight as calculated relative to polystyrene standards of 1,000 g/mol to 100,000 g/mol.

* * * * *